United States Patent [19]

Yamazaki

[11] Patent Number: 5,208,594
[45] Date of Patent: May 4, 1993

[54] SIGNAL PROCESSOR THAT USES A DELTA-SIGMA MODULATION

[75] Inventor: Nobuhide Yamazaki, Yokohama, Japan

[73] Assignee: Ricoh Company, Ltd.

[21] Appl. No.: 874,817

[22] Filed: Apr. 28, 1992

[30] Foreign Application Priority Data

May 2, 1991 [JP] Japan .................. 3-130586
May 2, 1991 [JP] Japan .................. 3-130593

[51] Int. Cl.$^5$ .................. H03M 3/02
[52] U.S. Cl. .................. 341/143; 341/110
[58] Field of Search .................. 341/110, 143, 166, 167

[56] References Cited

U.S. PATENT DOCUMENTS

| | | | |
|---|---|---|---|
| 3,857,111 | 12/1974 | Deschenes et al. | 341/143 |
| 4,355,304 | 10/1982 | Kasuga et al. | 341/110 |
| 4,811,019 | 3/1989 | Julstrom et al. | 341/143 |
| 4,901,077 | 2/1990 | Christopher | 341/143 |
| 4,983,967 | 1/1991 | McKenzie | 341/110 |
| 5,068,661 | 11/1991 | Kaneaki et al. | 341/143 |
| 5,115,241 | 5/1992 | Ishikawa | 341/143 |

Primary Examiner—Marc G. Hoff
Attorney, Agent, or Firm—Cooper & Dunham

[57] ABSTRACT

A signal processing system comprises a delta-sigma modulation unit supplied with an input analog signal for producing one-bit data as a result of a delta-sigma modulation, an arithmetic unit supplied with the output one-bit data of the delta-sigma modulation unit for applying a predetermined arithmetic operation thereon, an integration unit for integrating an output of the arithmetic unit to produce multiple-bit data as an output, a comparator unit supplied with the multiple-bit data from the integration unit at a first input port and multiple-bit reference data at a second input port for producing one-bit data as a result of comparison, a feedback unit supplied with the output of the comparator unit for producing the multiple-bit reference data based upon the one-bit data produced by the comparator unit such that said reference data predicts the multiple-bit data supplied to the first input port, and a digital-to-analog conversion unit supplied with said output one-bit data of the comparator unit for converting the same to an analog output signal.

9 Claims, 10 Drawing Sheets

SIGNAL PROCESSOR THAT USES A DELTA-SIGMA MODULATION

BACKGROUND OF THE INVENTION

The present invention generally relates to signal processors, and more particularly to a signal processor that is used for a digital processing of an analog signal and has a construction suitable for assembling into an integrated circuit.

In relation to the high resolution, low cost AD/DA converters, the signal processing that uses the oversampling technique and delta-sigma modulation is proposed.

Figure 1:
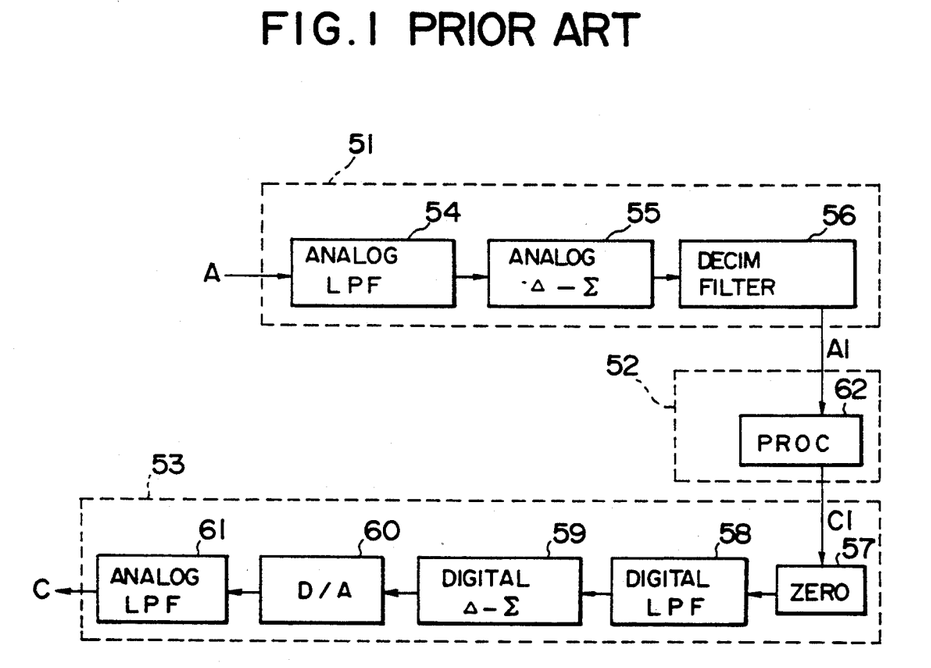
FIG. 1 is a block diagram showing the construction of a conventional signal processing system that uses a delta-sigma modulation.

FIG. 1 shows an example of such a signal processing as applied for magnifying an analog signal by a predetermined factor. The system of FIG. 1 includes an A/D conversion unit 51 for converting an analog input signal A to a digital signal $A_1$, a processing unit 52 for applying a digital multiplication process on the digital signal $A_1$ to produce a digital signal $C_1$, and a D/A conversion unit 53 for converting the digital signal $C_1$ to an analog signal C.

The A/D conversion unit 51 includes an analog filter 54 for filtering the input analog signal A, an analog delta-sigma modulator 55 for producing one-bit PDM data from the analog signal supplied from the filter 54 by an oversampling process, and a decimation filter 54 supplied with the one-bit PDM data of the delta-sigma modulator 55 for reducing the sampling rate by converting the one-bit data to multiple-bit PCM data. In a typical example, a sampling rate of 7.68 M samples/sec is used in the delta-sigma modulator 55, while the decimation filter reduces the sampling rate for example to 48 k samples/sec to form the foregoing digital PCM data $A_1$. The PCM data $A_1$ may be 16 bit-data. Typically, the output PDM data of the delta-sigma modulator 55 produces a bipolar pulse train wherein the density of the positive pulses and the negative pulses changes in response to the input analog signal A.

The processing unit 52 includes a usual digital multiplier circuit 62 that applies a predetermined constant to the digital signal $A_1$. The multiplier circuit 62 supplies the result of processing to the D/A conversion unit 53 as the multiple-bit digital data $C_1$.

The D/A conversion unit 52 includes a zero-interpolation circuit 57, a digital low pass filter 58, a digital delta-sigma modulator 59, a one-bit D/A converter 60, and an analog low-pass filter 61. There, the zero interpolation circuit 57 is supplied with the digital signal $C_1$ and applies an oversampling process upon the signal $C_1$. Thereby, the sampling rate is increased to 7.68 M samples/sec. The digital low-pass filter 58 is supplied with the output of the zero-interpolation circuit 57 and eliminates the alias components that appear in each 48 kHz interval. Further, the digital delta-sigma modulator 59 is supplied with the output of the digital low-pass filter 58 and converts the same to one-bit PDM data. The one-bit PDM data thus produced by the delta-sigma modulator 59 is then supplied to the one-bit D/A converter 60 for D/A conversion. Finally, the output analog signal produced by the one-bit D/A converter 60 is passed through the analog low-pass filter 61, and the output analog signal C is obtained. By combining the oversampling process and delta-sigma modulation, the system of FIG. 1 can provide a multiplication of analog signals with an improved precision or resolution.

Figure 2:
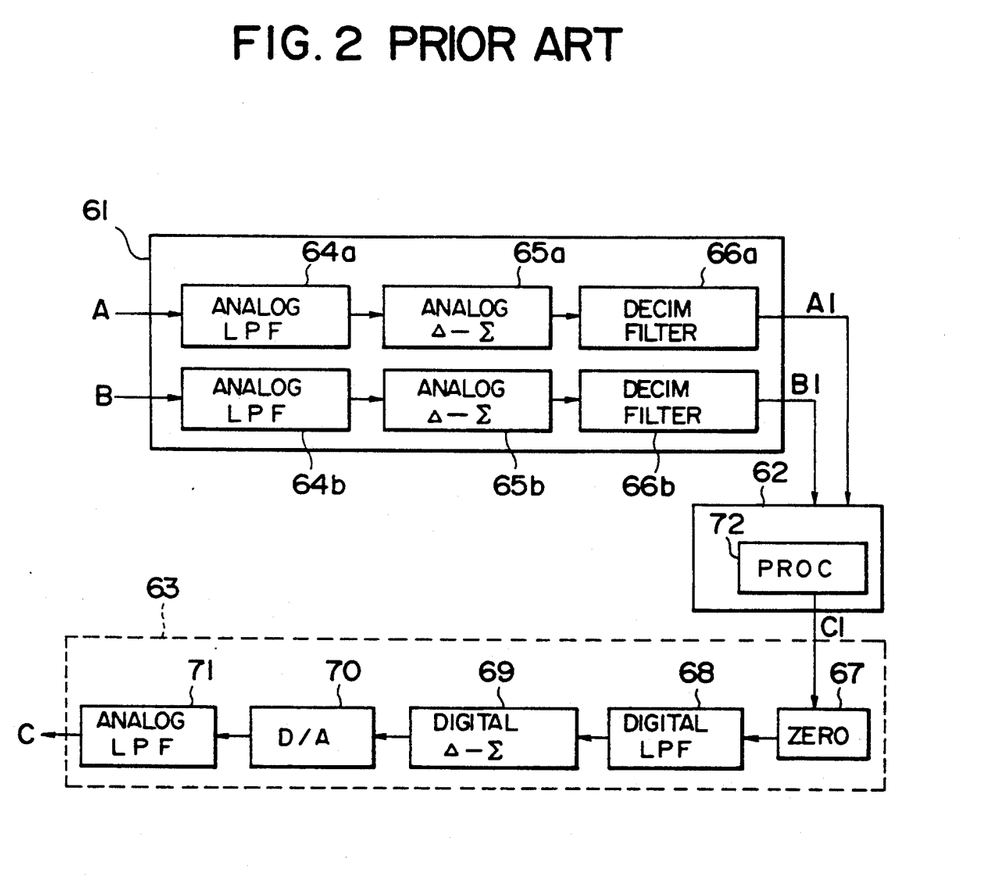
FIG. 2 is a block diagram showing the construction of another conventional signal processing system that uses the delta-sigma modulation.

FIG. 2 shows another example of the use of the oversampling and delta-sigma modulation for adding analog input signals A and B.

Referring to FIG. 2, the system includes an A/D conversion unit 61 supplied with the analog input signals A and B for converting the same to digital signals $A_1$ and $B_1$, a processing unit 62 supplied with the digital signals $A_1$ and $B_1$ for adding the same to produce a digital output signal $C_1$, and a D/A conversion unit 63 supplied with the digital output signal $C_1$ for producing an analog output signal C.

There, the A/D conversion unit 61 includes a first channel for processing the input signal A and a second channel for processing the input signal B, wherein the first channel includes an analog filter 64a corresponding to the analog filter 54 of FIG.1 for filtering the input analog signal A. The analog signal A thus passed through the filter 64a enters into an analog delta-sigma modulator 65a corresponding to the delta-sigma modulator 55 of FIG.1 and is converted to one-bit PDM data. This one-bit PDM data is supplied to a decimation filter 66a corresponding to the decimation filter 56 of FIG.1 wherein it is converted to multiple bit PCM data upon decimation. The output of the decimation filter 66a is supplied to the processing unit 62 as the digital signal $A_1$.

The second channel has a substantially identical construction and includes an analog filter 64b, an analog delta-sigma modulator 65b, and a decimation filter 66b. As the construction and function of the second channel are substantially identical with those of the first channel, further description thereof will be omitted. The second channel outputs PCM data $B_1$ in correspondence to the input analog signal B.

The processing unit 62 includes a digital adder circuit 72 for adding the input PCM data $A_1$ and $B_1$. Thereby, the adder circuit 72 produces output PCM data $C_1$.

The D/A conversion unit 63 has a construction substantially identical with the D/A conversion unit 53 of FIG.1 and includes a zero-interpolation circuit 67 corresponding to the zero-interpolation circuit 57, a digital low pass filter 68 corresponding to the digital low pass filter 58, a digital delta-sigma modulator 69 corresponding to the digital delta-sigma modulator 59, a one-bit D/A converter 70 corresponding to the one-bit D/A converter 60, and an analog low-pass filter 71 corresponding to the analog low-pass filter 61. As the construction and function of the unit 63 are substantially identical with those of the unit 53, further description will be omitted.

In any of the systems of FIG. 1 and FIG. 2, one can achieve a high precision processing by the use of the oversampling process in the delta-sigma modulator. More specifically, one can suppress the quantum noise associated with the analog-to-digital conversion by using a very large sampling rate as compared with the Nyquist frequency as is well known in the art. Thus, the signal processing system of FIG. 1 or FIG. 2 is suitable for a high precision and high resolution digital processing of analog signals and finds applications in various fields such as telecommunications, audio systems, voice synthesis, etc.

In the signal processing system of FIG. 1 or FIG. 2, it should be noted that the digital filters such as the decimation filters 56, 66a, 66b used for processing the output of the delta-sigma modulator or the digital low-pass filters such as the filters 58 and 68 that processes the digital PCM data to be supplied to the digital delta-sigma modulator are the essential device. When the design of these digital filters is inappropriate, there may be a case wherein an alias noise is mixed in the output analog signal C. Further, the digital filters may cause a delay in the output. In order to avoid these problems, one has to use a complex construction for the digital filters. On the other hand, such a complex construction of the digital filters raises a problem of assembling the system as an integrated circuit.

SUMMARY OF THE INVENTION

Accordingly, it is a general object of the present invention to provide a novel and useful signal processing system, wherein the foregoing problems are eliminated.

Another and more specific object of the present invention is to provide a signal processing system for processing a signal with a high precision and a high speed, wherein the system has a simple construction suitable for constructing in the form of integrated circuit.

Another object of the present invention is to provide a signal processing system for processing an input analog signal, comprising: delta-sigma modulation means supplied with said input analog signal for applying thereon a delta-sigma modulation, said delta-sigma modulation means producing one-bit data sequentially in response to said input analog signal; arithmetic means supplied with said output one-bit data of said delta-sigma modulation means for applying a predetermined arithmetic operation thereon; integration means supplied with an output of said arithmetic means for integrating the same to produce multiple-bit data as an output; comparator means having first and second input ports, said comparator means being supplied with said multiple-bit data from said integration means at said first input port and multiple-bit reference data at said second input port for producing one-bit data as an output; feedback means supplied with said output of said comparator means for producing said multiple-bit reference data based upon said one-bit data produced by said comparator means such that said reference data predicts said multiple-bit data supplied to said first input port, said feedback means supplying said multiple-bit reference data to said second input port of said comparator means; and digital-to-analog conversion means supplied with said output one-bit data of said comparator means for converting the same to an analog output signal. According to the present invention, the complex, high precision digital filters such as the decimation filters and the digital low-pass filters needed in the conventional system can be eliminated, and the circuit construction of the signal processing system can be simplified significantly. Thereby, the system of the present invention can easily be implemented in the form of integrated circuit (IC), without sacrificing the resolution or precision of signal processing. Further, as a result of elimination of the digital filters, the operational speed of the system is improved.

Other objects and further features of the present invention will become apparent from the following detailed description when read in conjunction with the attached drawings.

DETAILED DESCRIPTION OF THE PREFERRED EMBODIMENTS

Hereinafter, preferred embodiments of the present invention will be described.

Figure 3:
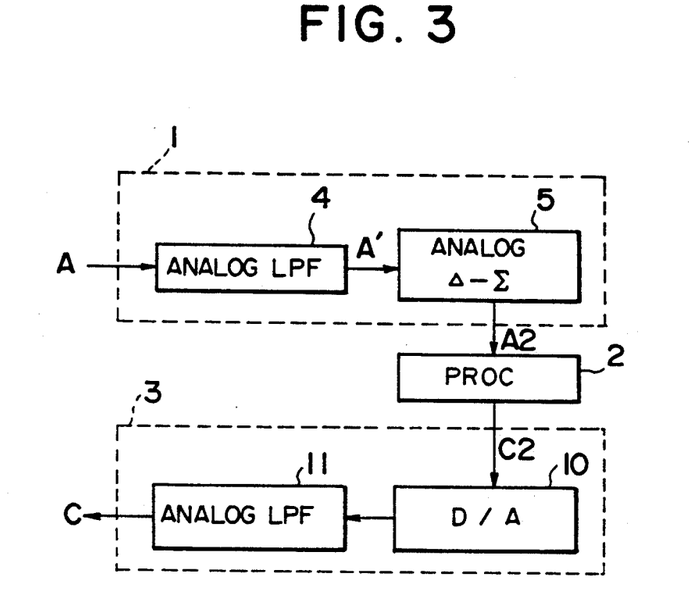
FIG. 3 is a block diagram showing the construction of a signal processing system according to a first embodiment of the present invention.

Referring to FIG. 3 showing a first embodiment of the present invention, the signal processing system is a multiplier system for modifying the amplitude of an input analog signal by a predetermined factor, and includes an A/D conversion unit 1 supplied with the analog input signal A for converting the same to digital data $A_2$, a processing unit 2 supplied with the digital data $A_2$ for multiplying the predetermined factor thereon to produce digital data $C_2$, and a D/A conversion unit 3 supplied with the digital data $C_2$ for converting the same to an analog output signal C.

The A/D conversion unit 1 includes an analog filter 4 for filtering the input analog signal to produce an analog signal A' from which unnecessary signal components are eliminated, and an analog delta-sigma modulator 5 supplied with the analog signal A' from the analog filter 4 for converting the same to digital data $A_4$ by applying an oversampling and delta-sigma modulation technique.

Figure 4:
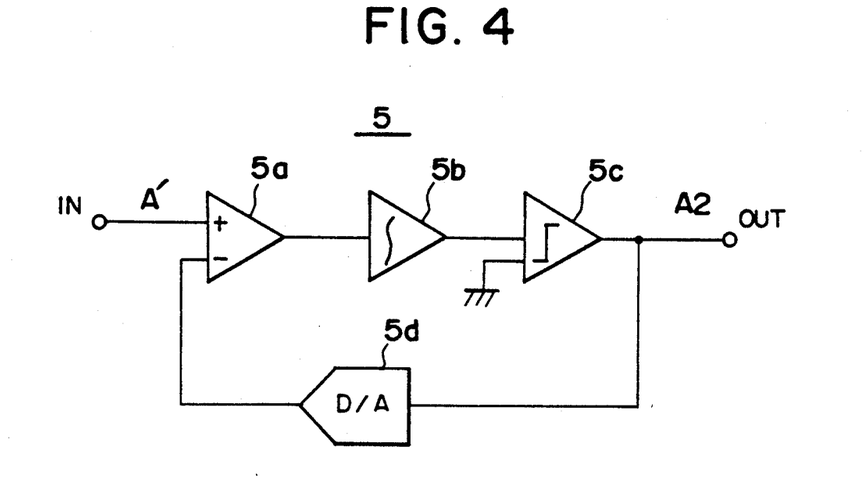
FIG. 4 is a circuit diagram showing the construction of a delta-sigma modulator used in the system of FIG. 3.

FIG. 4 shows the construction of the analog delta-sigma modulator 5.

Referring to FIG. 4, the delta-sigma modulator 5 includes a differential amplifier 5a having a non-inverting input terminal and an inverting input terminal, wherein the analog signal A' is supplied to the non-inverting input terminal and a feedback analog signal is supplied to the inverting input terminal as will be described. The differential amplifier 5a thereby produces an output analog signal in correspondence to a difference between the signal A' at the non-inverting input terminal and the feed back signal at the inverting input terminal.

The output signal of the differential amplifier 5a is then supplied to an analog integrator circuit 5b for an integral operation, and an output of the integrator circuit 5b representing the result of integration is supplied to a comparator 5c. There, the comparator 5c is driven at a clock frequency substantially higher than the Nyquist frequency, and produces one-bit pulse train that contains therein a number of bipolar pulses. In a typical example, a sampling rate of 7.68 M samples/sec is used for the analog signal. When the input analog signal A is positive, the output of the comparator 5c includes positive output pulses with a probability larger than the negative output pulses. On the other hand, when the input analog signal A is negative, the probability of the negative pulses exceeds the probability of the positive pulses. Further, when the input analog signal A is zero, the positive pulses and negative pulses appear with the same probability in the output pulse train of the comparator 5c. The output of the comparator 5c forms thereby a PDM signal.

The output of the comparator 5c is on the one hand supplied to an output terminal of the delta-sigma modulator 5 and on the other hand to a one-bit D/A converter 5d that converts the one-bit output pulse of the comparator 5c to an analog signal, wherein the output analog signal is supplied to the inverting input terminal of the differential amplifier 5a as a feedback signal.

The delta-sigma modulator 5 of FIG. 3 thereby detects the differential of the input analog signal in the differential amplifier 5a and integrates the differential in the integrator circuit 5b as usual in the delta-sigma modulation. On the other hand, the delta-sigma modulator 5 of FIG. 3 outputs the one-bit pulse data of the comparator 5c directly as output data in contrast to the conventional delta-sigma modulator, which converts the one-bit pulse data to multiple bit data by a decimation digital filter. Thereby, one can eliminate the complex digital filters in the present invention and the construction of the delta-sigma modulator 5 is significantly simplified.

Figure 5:
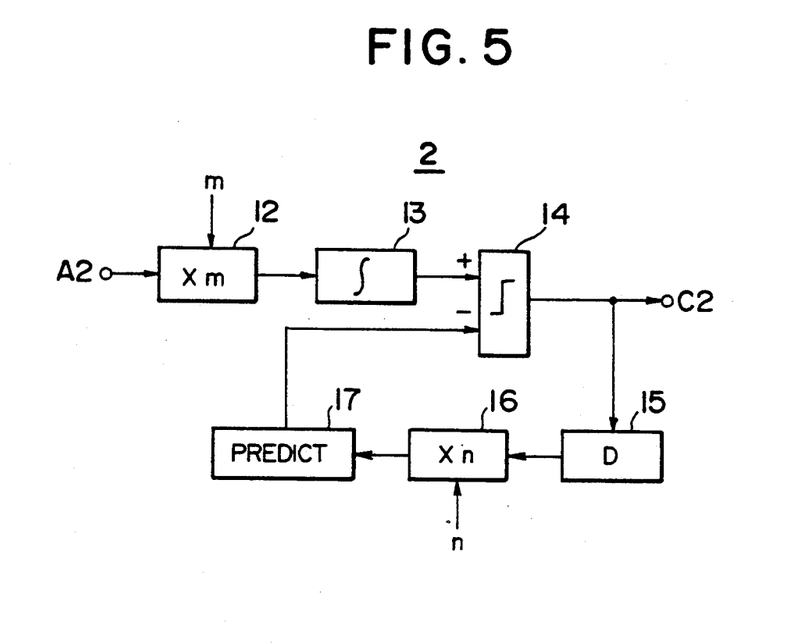
FIG. 5 is a block diagram showing the essential part of the signal processing system of FIG. 3.

FIG. 5 shows the construction of the processing unit 2.

Referring to FIG. 5, there is provided a multiplier 12 supplied with the one-bit output data $A_2$ from the delta-sigma modulator 5 for multiplying a predetermined constant m thereto. The multiplier 12 thereby produces output digital data indicative of the result of multiplication in the form of multiple-bit data and supplies the same to an integrator circuit 13 for digital integration. The integrator circuit 13 in turn produces multiple-bit output data indicative of the result of integration and supplies the same to a digital comparator 14. There, the digital comparator 14 is supplied with reference data in addition to the output data of the digital integrator 13 as will be described later, and produces one-bit output data as the output data $C_2$ in response to the result of comparison of the output data of the integrator circuit 13 and the reference data.

Further, the one-bit output data $C_2$ of the digital comparator 14 is supplied to a digital delay circuit 15 for causing a predetermined delay, and the digital data thus delayed in the delay circuit 15 is supplied to a second multiplier 16 that applies a predetermined constant n to each pulse of the output data $C_2$. The digital data $C_2$ thus processed in the multiplier circuit 16 is supplied to a digital prediction filter 17 that converts the one-bit data supplied thereto into multiple-bit data.

The multiple-bit data thus produced is supplied to the digital comparator circuit 14 as the reference data. Thereby, the digital comparator circuit 14 produces a positive output pulse when the value of the output data of the integrator circuit 13 exceeds the value of the reference data. When the value of the reference data exceeds the value of the output data of the integrator circuit 13, on the other hand, a negative output pulse is produced by the digital comparator circuit 14. When both input data of the comparator circuit 14 have the same value, the circuit 14 produces either a positive pulse or a negative pulse with the same probability. In a typical example, the digital delay circuit 15 is formed from a register and causes a delay corresponding to one clock.

Figure 6:
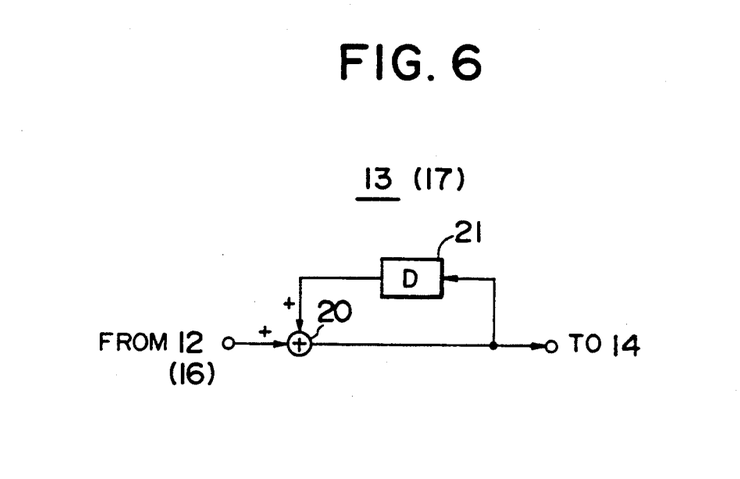
FIG. 6 is a circuit diagram showing the construction of a digital integrator circuit and a prediction filter used in the system of FIG. 5 in combination with the delta-sigma modulator of FIG. 4.

FIG. 6 shows the construction of the integrator circuit 13. FIG. 6 shows also the construction of the prediction filter 17.

Referring to FIG. 6, the circuit includes an adder 20 supplied with the output of the multiplier circuit 12 and a register 21 that is supplied with the output of the adder 20 for feeding back the same to the adder 20 after a delay of one clock, wherein the adder adds the output of the multiplier circuit 12 and the output of the register 21 with each other to produce data indicative of the result of integration of the output data of the circuit 12. Similarly, the prediction filter 17 is supplied with the output data of the multiplier circuit 16 for producing data indicative of the result of integration of the output data of the circuit 16. In response to the output of the integrator circuit 13 and the output of the prediction filter 17, the comparator circuit 14 produces the output one-bit data $C_2$ as the data indicative of the content of the input analog signal A multiplied by a factor of m/n.

Referring again to FIG. 3 again, the output one-bit data $C_2$ is supplied to the D/A conversion unit 3, wherein the data $C_2$ is converted to an analog signal by a one-bit D/A converter 10 and outputted as the output analog signal C after passing an analog low pass filter 11. As the construction of the one-bit D/A converter 10 and the analog low pass filter is well known, further description thereof will be omitted.

Figure 7:
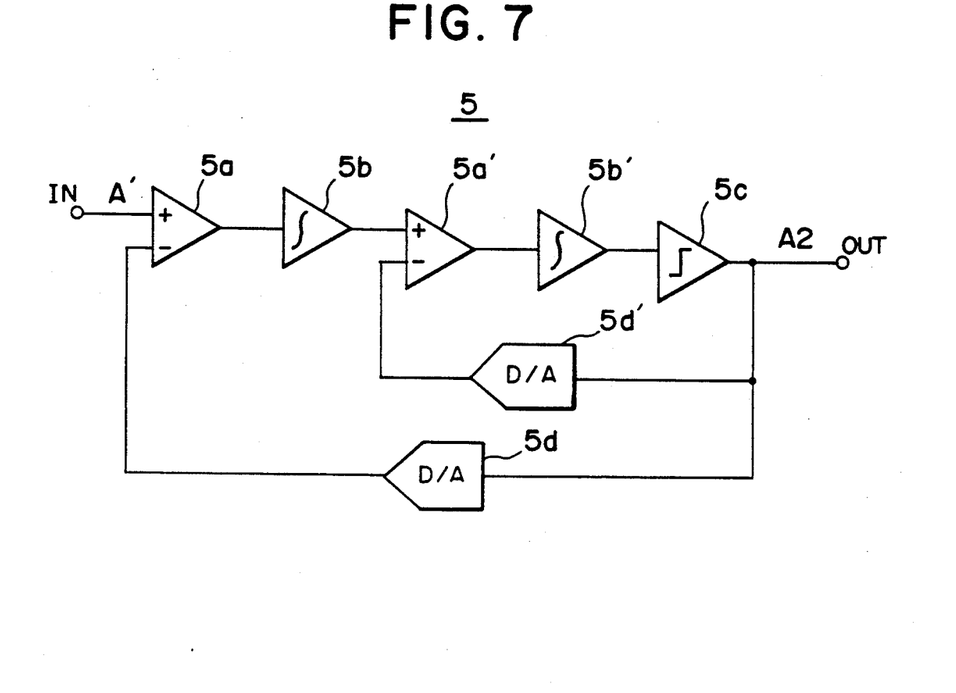
FIG. 7 is a circuit diagram showing another construction of the delta-sigma modulator used in the system of FIG. 3.

FIG. 7 shows a case wherein a multiple-order delta-sigma modulation is applied in the delta-sigma modulator 5 of FIG. 3.

Referring to FIG. 7, there are provided an additional differential amplifier 5a' and an additional integrator circuit 5b' for processing the output of the integrator circuit 5b for the second order delta-sigma modulation. In correspondence to the additional differential amplifier 5a' and the additional integrator circuit 5b', there is provided an additional D/A converter 5d' of which construction is substantially identical with the D/A converter 5d.

Figure 8:
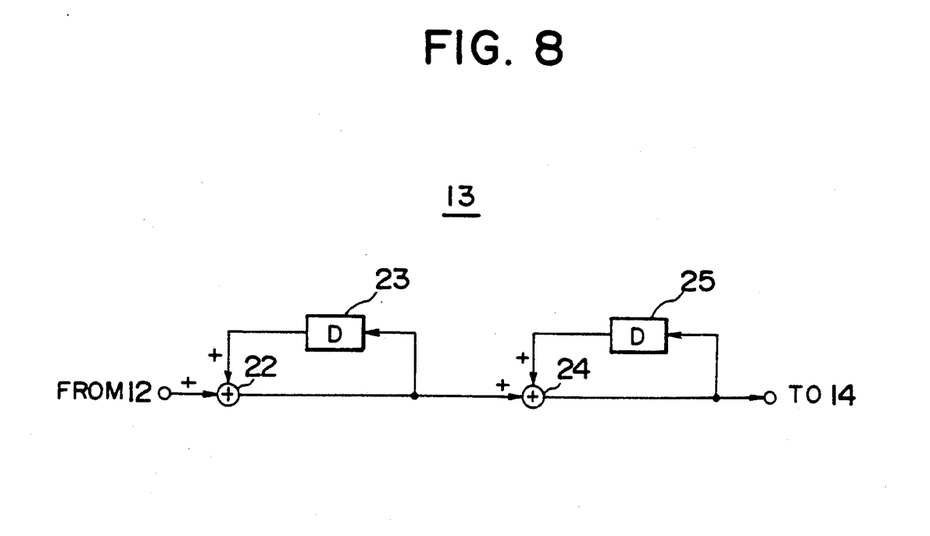
FIG. 8 is a circuit diagram showing the construction of the digital integrator circuit used in the system of FIG. 5 in combination with the delta-sigma modulator of FIG. 7.
Figure 9:
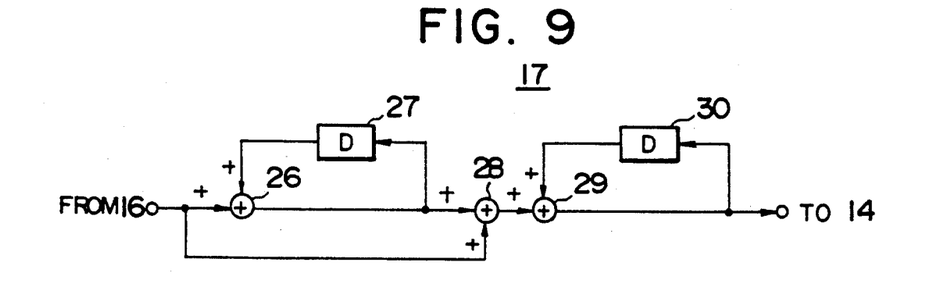
FIG. 9 is a circuit diagram showing the construction of a prediction filter used in the circuit of FIG. 5 in combination with the delta-sigma modulator of FIG. 7.

When such a multiple-order delta-sigma modulation is employed in the delta-sigma modulator 5, the digital integrator circuit 13 as well as the prediction filter 17 are constructed as shown in FIG. 8 and 9 respectively, wherein the integration circuit 13 includes the integration circuit of FIG. 6 that is cascaded in a plurality of stages corresponding to the number of order of the delta-sigma modulation. Similarly, the prediction filter 17 of FIG. 9 includes the circuit of FIG. 6 cascaded in a plurality of stages corresponding to the number of order of the delta-sigma modulation. As the construction of the circuit of FIG. 8 is obvious from the construction of the circuit of FIG. 6, further explanation thereof will be omitted.

In the circuit of FIG. 9, the prediction filter 17 includes a first integrator circuit that in turn includes an adder 26 and a feedback register 27, and a second integrator circuit including adders 28 and 29 and a feedback register 30. There, the output of the multiplier 16 is supplied to the adder 26, wherein the adder 26 adds the output of the multiplier 16 and the output of the adder 26 after delaying the latter by one clock by passing through the feedback register 27. The adder 28 in turn is supplied with the output of the adder 26 and further with the output of the multiplier circuit 16 as first and second inputs and adds these with each other. Further, the adder 29 is supplied with the output of the adder 28 on the one hand and the output of the adder 28 itself after delaying the latter by one clock in the register 30, and adds these with each other. Thereby, the integration of the output of the circuit 16 is applied twice in correspondence to the two-fold integration achieved in the delta-sigma modulator 5.

Figure 10:
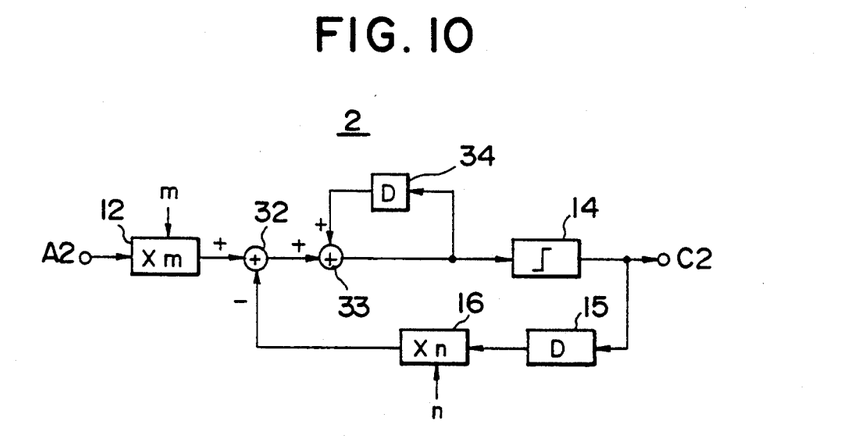
FIG. 10 is a circuit diagram showing another example of the construction of the system of FIG. 5 that is used in combination with the delta-sigma modulator of FIG. 4.

FIG. 10 shows another example of the construction of the processing unit 2 used in combination with the first-order delta-sigma modulation. In the present example, the output of the multiplier circuit 12 is supplied to an adder 32 for differentiation, and the output of the adder 32 is integrated in an integrator circuit that includes an adder 33 and a feedback register 34. The output of the integrator circuit is further supplied to a comparator 14 that produces one-bit output as the output data $C_2$. This output $C_2$ is further fed back to the adder 32 for subtraction from the output of the multiplier circuit 12, after passing through the register 15 and the multiplier circuit 16. In the construction of FIG. 10, the prediction filter 17 includes the adders 32 and 33 and the feedback register 34, in addition to the feedback register 15 and the multiplier circuit 16. Thereby, the elements 33 and 34 are used both for the integrator circuit 13 and the prediction filter 17. By using the circuit elements commonly by the integrator circuit 13 and the prediction filter 17, one can simplify the circuit construction of the processing unit 2.

Figure 11:
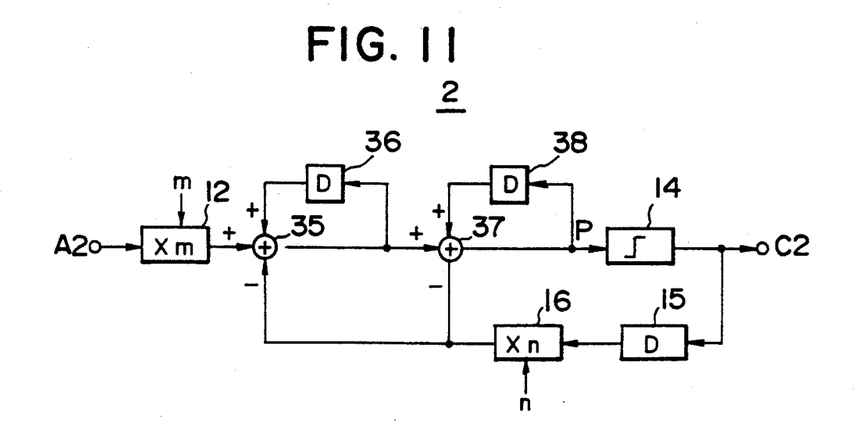
FIG. 11 is a circuit diagram showing another construction of the system of FIG. 5 that is used in combination with the delta-sigma modulator of FIG. 7.

FIG. 11 shows an example of the construction of the processing unit 2 used in combination with the second-order delta-sigma modulation.

Referring to FIG. 11, the processing unit 2 includes adders 35 and 36 as well as corresponding feedback registers 36 and 38 that form the two-stage integrator circuit 13. Simultaneously, the adders 35 and 36 as well as the registers 37 and 38 form a part of the feedback register 17, wherein the adders 35 and 37 act as a subtracter that subtracts the output of the multiplier circuit 16 from the input data supplied thereto.

Figure 12A:
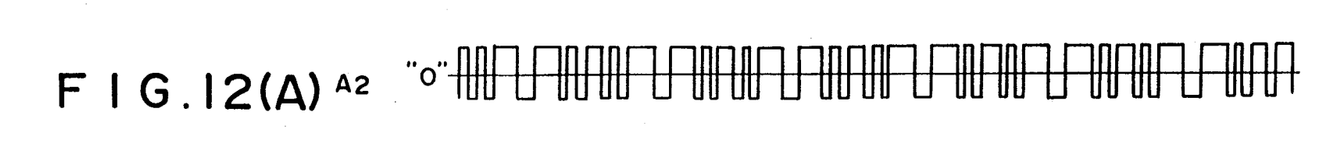
FIGS. 12(A)–12(C) are diagrams showing the waveform of various signals appearing in the circuit of FIG. 11.
Figure 12B:
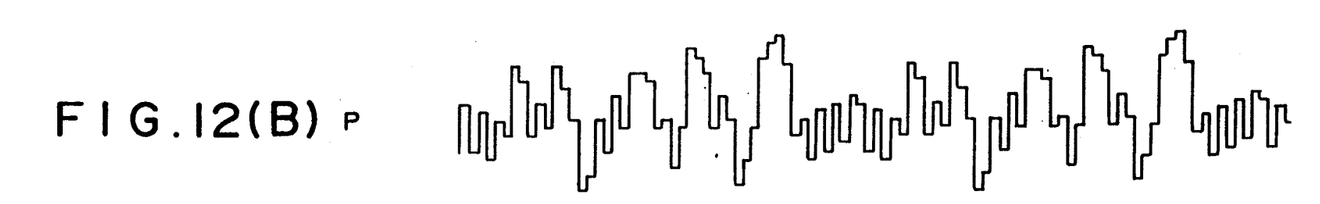
Figure 12C:
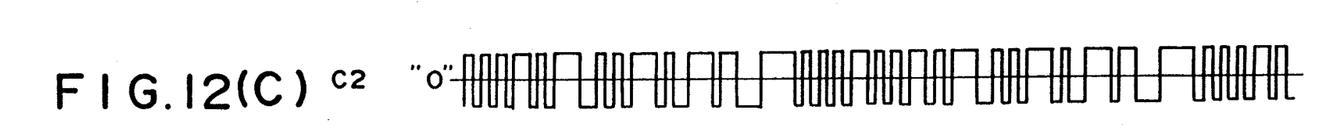

FIGS. 12(A)–12(C) show the waveform of various signals appearing in the circuit of FIG. 11, wherein FIG. 12(A) shows the one-bit input data $A_2$ that is supplied to the processing unit 2 from the D/A conversion unit 1. This data $A_2$ represents the result of the delta-sigma modulation of a D.C. signal having a level equal to $\frac{1}{4}$ of the maximum amplitude of the analog input signal. FIG. 12(B), on the other hand, represents multiple-bit data P that is supplied to the comparator 14. Further, FIG. 12(C) represents the one-bit data $C_2$ that is outputted from the comparator 14. In the illustrated example of FIGS. 12(A)–12(C), a factor of 2 is used for the multiplier m, while a factor of 3 is used for the multiplier n.

The output data $C_2$ is then supplied to the D/A conversion unit 3, wherein the data $C_2$ is converted to an analog signal by the one-bit D/A converter 10. The output of the D/A converter 10 is passed through an analog low-pass filter 11 to form the output analog signal C. As the construction of the one-bit D/A converter 10 and the analog low-pass filter 11 is obvious, further description thereof will be omitted.

According to the present embodiment, one can eliminate the complex and expensive digital filters from the signal processing system and the construction of the system becomes substantially simple. Thereby, the signal processing system of the present embodiment is suited for implementing in the form of monolithic, integrated circuits. Further, the system of the present embodiment can be constructed with a low cost.

Figure 13:
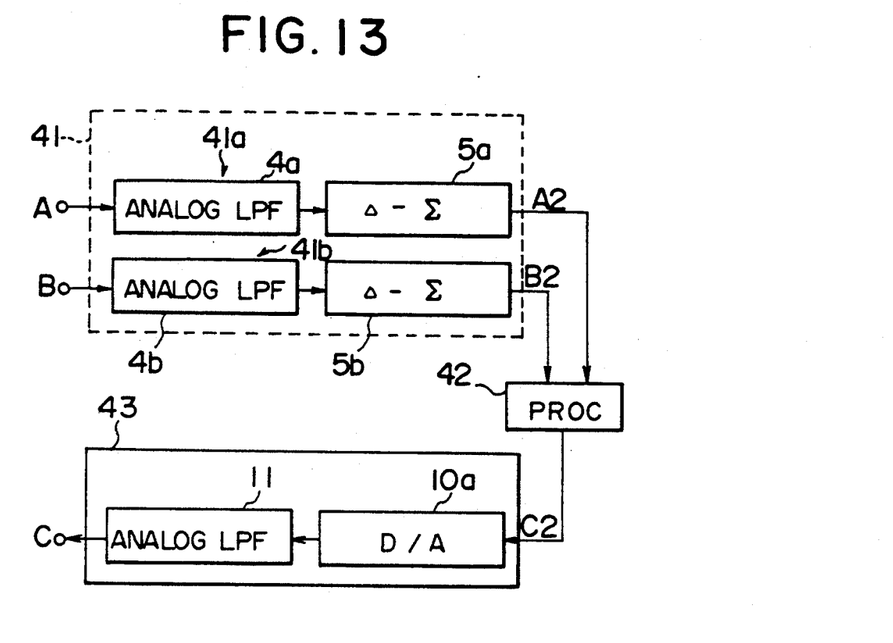
FIG. 13 is a block diagram showing the signal processing system according to a second embodiment of the present invention.

Next, a second embodiment of the present invention will be described with reference to FIG. 13 showing a case wherein the signal processor of the present invention is implemented as an adder system for adding two analog input signals A and B.

Referring to FIG. 13, the system includes a D/A conversion unit 41 that includes a first channel 41a supplied with the input analog signal A for converting the same to one-bit data $A_2$ by the delta-sigma modulation, and a second, separate channel 41b supplied with the input analog signal B for converting the same to one-bit data $B_2$ also by the delta-sigma modulation. Each channel has a construction identical with the A/D conversion unit 1 of FIG. 3 and includes an analog filter 4a or 4b and a corresponding delta-sigma modulator 5a or 5b.

Figure 14:
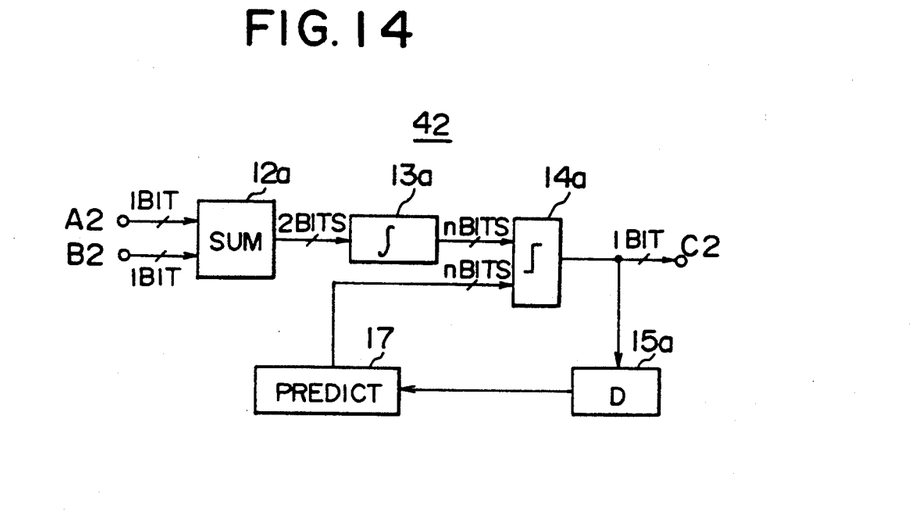
FIG. 14 is a block diagram showing the essential part of the system of FIG. 13.

The output one-bit data $A_2$ and $B_2$ thus produced are supplied to a processing unit 42 of which construction is shown in FIG. 14.

Referring to FIG. 14, the output one-bit data $A_2$ and $B_2$ are supplied to a digital adder 12a, wherein the data $A_2$ and the data $B_2$ are added with each other to form two-bit output data as a result of the operation. This two-bit data is supplied to a digital integrator circuit 13a identical with the digital integrator circuit 13 for digital integration, and the circuit 13a produces n-bit output data as a result of the integration. The output of the circuit 13a is then supplied to a digital comparator circuit 14a corresponding to the circuit 14 of FIG. 5 for producing the output one-bit data $C_2$ This output data $C_2$ is on the one hand supplied to a D/A conversion unit 43 substantially identical with the D/A conversion unit 3 of FIG. 3, and on the other hand to the comparator circuit 14a as feedback reference data, after passing through a delay circuit 15a substantially identical with the circuit 15 of FIG. 5 and further through a prediction filter 17a that is substantially identical with the circuit 17 of FIG. 5.

The one-bit data $C_2$ is then converted to an analog signal in the D/A conversion unit 43 by a one-bit D/A converter 10a corresponding to the D/A converter 10 and an analog low-pass filter 11a corresponding to the filter 11. Thereby, an output analog signal C is obtained similarly to the case of the first embodiment.

Figure 15:
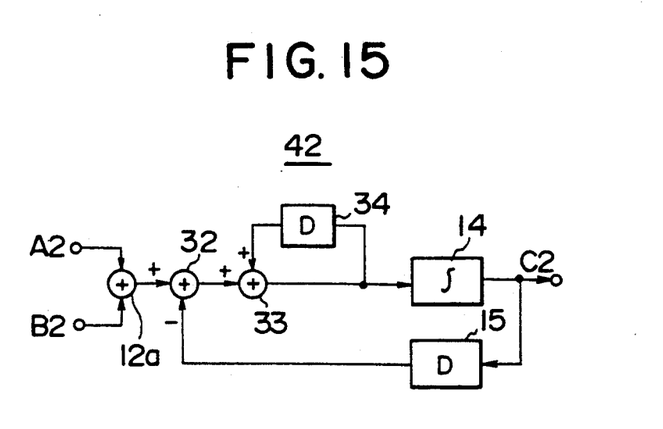
FIG. 15 is a circuit diagram showing an example of the circuit of the system of FIG. 14.

FIG. 15 shows an example of the processing unit 42 that is used in combination with the first-order delta-sigma modulation. The circuit of FIG. 15 is analogous to the circuit of FIG. 10 except that the multiplier circuit 12 is replaced with the adder 12a. As the construction and operation of this circuit are obvious, further description thereof will be omitted.

Figure 16:
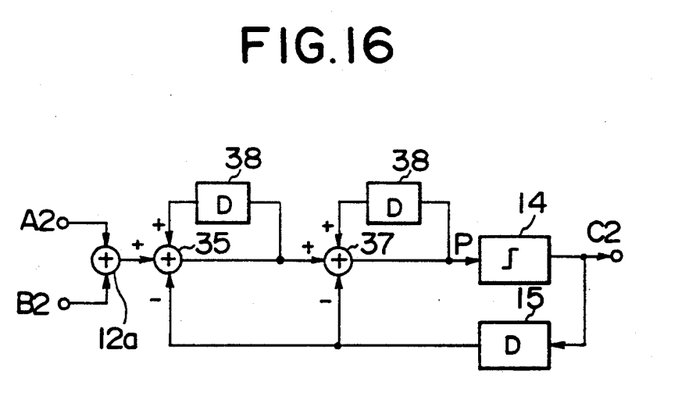
FIG. 16 is a circuit diagram showing another example of the circuit of the system of FIG. 14.

FIG. 16 shows another example of processing unit 42 that is used in combination with the second-order delta-sigma modulation. The circuit of FIG. 16 is analogous to the circuit of FIG. 11 except that the multiplier 12 of FIG. 11 is replaced by the adder 12a.

Figure 17A:
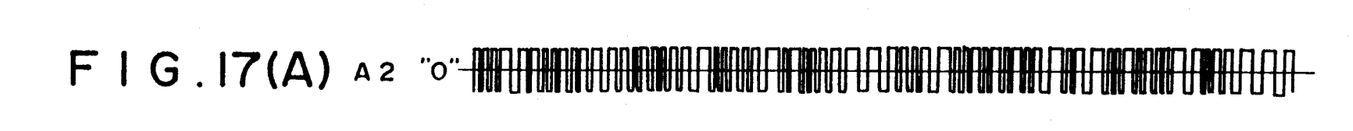
FIGS. 17(A)–17(D) are diagrams showing the waveform of various signals appearing in the circuit of FIG. 16.
Figures 17B, 17C, 17D:
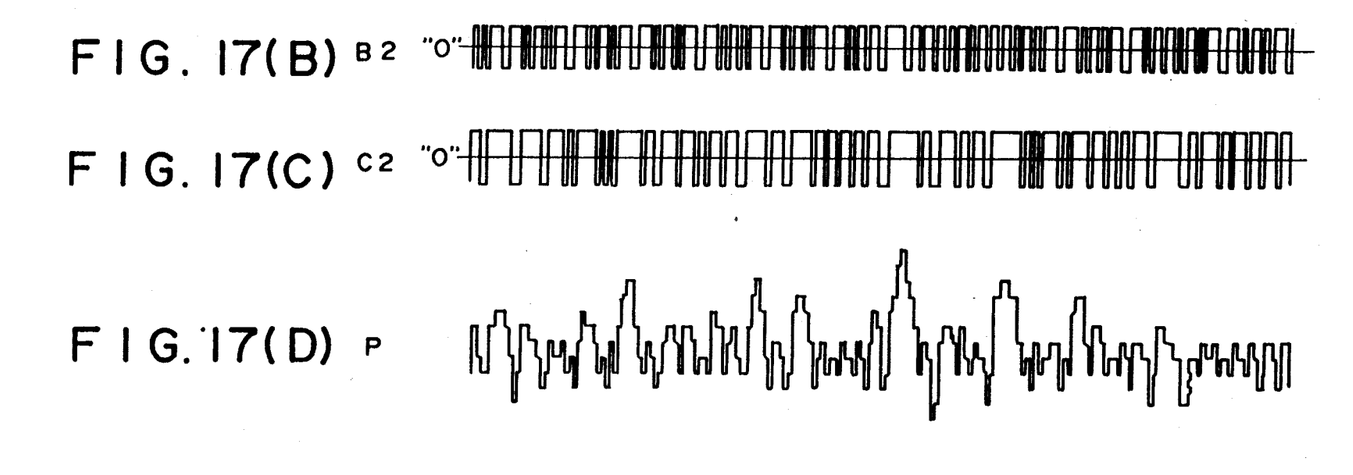

FIGS. 17(A)–17(D) show the waveform of various signals appearing in the circuit of FIG. 16, wherein FIG. 17(A) shows the one-bit digital data $A_2$ and FIG. 17(B) shows the one-bit digital $B_2$. There, the waveform of FIG. 17(A) corresponds to a d.c. signal having a level set to 3/16 of the maximum amplitude of the analog input signal A, while the waveform of FIG. 17(B) corresponds to a d.c. signal having a level set to ¼ of the maximum amplitude of the analog input signal B. The waveform of FIG. 17(C) shows, on the other hand, the output one-bit data $C_2$ as produced by the one-bit digital comparator 14, while the waveform of FIG. 17(D) shows multiple-bit data P that is supplied to the digital comparator 14.

According to the present embodiment, too, one can realize a high precision adder of analog signals with a simple construction suitable for the integrated circuits.

Other objects and further features of the present invention will become apparent from the foregoing detailed description when read in conjunction with the attached drawings.

What is claimed is:

1. A signal processing system for processing an input analog signal, comprising:
    delta-sigma modulation means supplied with said input analog signal for applying thereon a delta-sigma modulation, said delta-sigma modulation means producing one-bit data sequentially in response to said input analog signal;
    arithmetic means supplied with said output one-bit data of said delta-sigma modulation means for applying a predetermined arithmetic operation thereon;
    integration means supplied with an output of said arithmetic means for integrating the same to produce multiple-bit data as an output;
    comparator means having first and second input ports, said comparator means being supplied with said multiple-bit data from said integration means at said first input port and multiple-bit reference data at said second input port for producing one-bit data as a result of comparison of the multiple-bit data at said first input port and said reference data at said second input port;
    feedback means supplied with an output of said comparator means for producing said multiple-bit reference data based upon said one-bit data produced by said comparator means such that said reference data predicts said multiple-bit data supplied to said first input port, said feedback means supplying said multiple-bit reference data to said second input port of said comparator means; and
    digital-to-analog conversion means supplied with said output one-bit data of said comparator means for converting the same to an analog output signal.

2. A signal processing system as claimed in claim 1 in which said delta-sigma modulation means including a predetermined number of integrating stages, wherein said integration means includes a plurality of integrating stages corresponding, in number, to said predetermined number of integrating stages in said delta-sigma modulation means.

3. A signal processing system as claimed in claim 2 in which said feedback means comprises delay means for delaying said output of said comparator means and second integration means supplied with an output of said feedback means for integrating the same to produce said multiple-bit reference data.

4. A signal processing system as claimed in claim 3 in which said second integration means includes a plurality of integrating states corresponding, in number, to said predetermined number of integrating stages in said delta-sigma modulation means.

5. A signal processing system as claimed in claim 4 in which said integration means and said second integration means are formed of a common digital integration circuit.

6. A signal processing system as claimed in claim 1 in which said arithmetic means comprises multiplier means for multiplying a predetermined factor on said one-bit data supplied from said delta-sigma modulation means.

7. A signal processing system as claimed in claim 6 in which said feedback means comprises multiplier means for multiplying a predetermined factor on said one-bit data supplied from said comparator means.

8. A signal processing system as claimed in claim 7 in which said delta-sigma modulation means comprises a plurality of channels each having a same construction, each channel of said delta-sigma modulation means being supplied with an analog signal for applying thereon said delta-sigma modulation and producing one-bit data sequentially in response to said input analog signal, said arithmetic means being supplied with said one-bit data from each channel of said delta-sigma modulation means for adding the same to produce said output as multiple-bit data.

9. A method for processing an analog signal, comprising the steps of:
    applying a delta-sigma modulation to said analog signal to produce time-sequentially one-bit data indicative of the result of said delta-sigma modulation;
    applying a predetermined arithmetic operation upon said one-bit data time-sequentially to produce processed data;
    predicting said processed data based upon said processed data that have been produced previously to produce reference data;
    comparing said processed data and said reference data to produce, time-sequentially, one-bit data indicative of the result of comparison; and
    converting said time-sequential one-bit data produced in said comparing step to an analog signal.

* * * * *